United States Patent
Kim et al.

[11] Patent Number: 6,160,437
[45] Date of Patent: Dec. 12, 2000

[54] MULTIPLEXER FOR PRODUCING MULTI-LEVEL OUTPUT SIGNALS

[75] Inventors: Kyu-Tae Kim, Pucheon-shi; Won-Kee Lee, Kumi-shi, both of Rep. of Korea

[73] Assignee: Hyundai Electronics Industries Co., Ltd., Ichon-shi, Rep. of Korea

[21] Appl. No.: 09/219,530

[22] Filed: Dec. 23, 1998

[30] Foreign Application Priority Data

Jan. 8, 1998 [KR] Rep. of Korea .......................... 98-286

[51] Int. Cl.[7] .................................................. H03K 17/62
[52] U.S. Cl. .......................... 327/408; 327/409; 327/410; 326/59; 326/60
[58] Field of Search .................................... 327/407–411; 326/59, 60

[56] References Cited

U.S. PATENT DOCUMENTS

| | | | |
|---|---|---|---|
| 5,438,295 | 8/1995 | Reddy et al. | 327/408 |
| 5,465,054 | 11/1995 | Erhart | 326/34 |
| 5,936,426 | 8/1999 | Wilson et al. | 327/408 |

*Primary Examiner*—Kenneth B. Wells
*Attorney, Agent, or Firm*—Fleshner & Kim, LLP

[57] ABSTRACT

The present invention discloses a multiplexer including that provides an output signal having a voltage range substantially equal to an input signal. The multiplexer further provides a breakdown prevention device that protects elements connected to an output terminal. The multiplexer can be used in an LCD driver or the like. The multiplexer according to the present invention can include a first switching circuit that receives a first input signal, a second switching circuit that receives a second input signal, wherein the first and second switching circuits are complementarily enabled in response to a three control signals, a third switching circuit that receives the first input signal switched from the first switching circuit and a fourth switching circuit that receives the second input signal switched from the second switching circuit. The third and fourth switching circuits are complementarily enabled by a selection signal to provide one of the first and second input signals to the output terminal. The multiplexer can further include a selection circuit to output one of a high prescribed voltage output signal and a low prescribed voltage output signal as the selection signal to enable the third and fourth switching circuits. Thus, the multiplexer can operate to allow two switching circuits to produce two different level output signals through a single output stage.

20 Claims, 4 Drawing Sheets

MULTIPLEXER FOR PRODUCING MULTI-LEVEL OUTPUT SIGNALS

BACKGROUND OF THE INVENTION

1. Field of the Invention

The present invention relates to a multiplexer, and in particular, to a multiplexer that produces multi-level output signals.

2. Discussion of the Related Art

A multiplexer is a logic circuit for selecting a signal from a plurality of input signals and producing the selected input signal as a single output signal. Selection of the output signal is accomplished by a selection signal, which is another input signal. Such multiplexers are useful in semiconductor circuits. Usually, operational characteristics of the multiplexer are understood as used in a digital logic circuit. In addition, the multiplexer can be used for analog signals or if digital signals and the analog signals are treated together.

The multiplexer having such a wide application has a very important position in a Liquid Crystal Display driving circuit (LCD driving circuit). The LCD driving circuit is a circuit for supplying picture signals to each pixel of LCD panels. In the LCD panels, a plurality of LCD cells forming the pixels are arranged in a matrix structure and are operated by picture signals transmitted through MOS transistors, which are switching elements. The LCD driving circuit is a circuit for providing proper picture signals to each of the MOS transistors.

Methods for driving a LCD include a dot inverting method, a column inverting method, a line inverting method, etc. and are implemented by inverting LCD panels in a unit of dot, column and line, respectively. Reasons for using such a variety of inverting methods is to prevent degradation of the LCD by supplying serial voltage, or to prevent flickers that occur when pixel voltage is varied in every fields or to prevent after images appearing when a still scene is provided for a long time.

To implement a method for inverting the LCD panels, polarities of the signals provided to each of the pixels of the LCD panels are alternatively inverted. That is, the polarities of the input signals are alternatively inverted to a positive (+) polarity and a negative (−) polarity centering around a common voltage (e.g., Vcom.)

The multiplexer as described above is used to alternatively invert the polarity of the input signal. A high voltage signal from a circuit for producing a high voltage and a low voltage signal from a circuit for producing a low voltage with reference to the common voltage is selectively taken using the multiplexer. Thus, the multiplexer receives both of the high voltage level signal and the low voltage level signal.

FIG. 1 is a prior art circuit of a transmission gate having a two-level output signal. As shown in FIG. 1, an input signal having 0V or 10V is transferred through the NMOS transistor logic or the PMOS transistor logic. The output path is controlled by an output enable signal EN or an output enable bar signal ENB, which are alternative signals of 0V or 10V.

Since the transmission gate of FIG. 1 is a circuit for obtaining a high voltage output signal through a standard or typical CMOS process, the supplying voltage of each of the MOS transistors is about 5V rated voltage. Thus, since a peak value of the input voltage, 10V can not be accepted, a shield voltage VSHLD is used to prevent the elements from being broken down. The shield voltage VSHLD is set to half of the input voltage, 5V.

When a signal of 5 to 10V is provided to an input stage IN of FIG. 1, an NMOS transistor Q1 is turned off. Accordingly, an output is not produced through the NMOS transistor logic. However, a PMOS transistor Q2 is turned on and provides a 5 to 10V voltage to a source of a PMOS transistor Q6. In this state, if the output enable bar signal ENB goes to 0V, the PMOS transistor Q6 is also turned on to produce the voltage of 5 to 10V, which was transferred from the PMOS transistor Q2. A PMOS transistor Q8 is also turned on in the same manner as the PMOS transistor Q2 to produce the voltage of 5 to 10V at the output stage OUT.

On the contrary, when the signal of 0 to 5V is provided to the input stage IN, the PMOS transistor Q2 is turned off. Accordingly, an output is not produced through the PMOS transistor logic. At this time, the NMOS transistor Q1 is turned on to provide the voltage of 0 to 5V to a drain of an NMOS transistor Q4. In this state, when the output enable signal EN goes to 10V, an NMOS transistor Q3 is turned on. The 10V voltage is provided to a gate of the NMOS transistor Q4, and then the NMOS transistor Q4 is also turned on. An NMOS transistor Q7 is also turned on in the same manner as the NMOS transistor Q1 to produce the voltage of 0 to 5V at the output stage OUT.

However, since in the transmission gate of FIG. 1, the range of the signal level for controlling the output path should be the same voltage level as the peak value of the input signal, it is difficult or impossible that the output voltage fully swings in the same voltage range as the input voltage range. In addition, elements connected to the output stage may be broken down by the high or the low output voltage. That is, in the transistor logic of the NMOS transistor logic and the PMOS transistor logic through which the output voltage does not pass, the transistor connected to the output stage (e.g., NMOS transistor Q7 or PMOS transistor Q8) can be broken down by the low or high output voltage.

The above references are incorporated by reference herein where appropriate for appropriate teachings of additional or alternative details, features and/or technical background.

SUMMARY OF THE INVENTION

An object of the present invention is to provide a circuit for producing multi-level output signals that substantially obviates at least one of the above-described problems caused by disadvantages of the related art.

Another object of the present invention is to provide a multiplexer that produces multi-level output signals having substantially equal voltage swings to an input signal.

Another object of the present invention is to provide a multiplexer that selectively produces two different-level output signals.

Another object of the present invention is to provide a multiplexer that includes a protection unit that prevents the breakdown of transistors in an output stage, which can occur when different-level signals are provided to a single output stage.

To achieve at least these objects and other advantages in a whole or in part and in accordance with the purpose of the present invention, as embodied and broadly described, the present invention provides a multiplexer including a first switching circuit that receives a first input signal; a second switching circuit that receives a second input signal, wherein the first and second switching circuits are complementarily enabled in response to first control signals; a third switching circuit that receives the first input signal switched from the first switching circuit; and a fourth switching circuit that receives the second input signal switched from the second switching circuit, wherein the third and fourth switching circuits are complementarily enabled by a selection signal to provide one of the first and second input signals to an output terminal.

To further achieve the above objects in a whole or in parts, a driver for an LCD is provided according to the present invention that includes a first D/A converter that outputs a first data signal; a second D/A converter that outputs a second data signal; a multiplexer that receives the first and second data signals and outputs one of the first and second data signals as an output signal, wherein the multiplexer has a first switching circuit that receives the first data signal, a second switching circuit that receives the second data signal, wherein the first and second switching circuits are complementarily enabled in response to first control signals, a third switching circuit that receives the first data signal switched from the first switching circuit, and a fourth switching circuit that receives the second data signal switched from the second switching circuit, wherein the third and fourth switching circuits are complementarily enabled by a selection signal to provide one of the first and second data signals as the output signal; and a buffer that buffers the output signal received from the multiplexer to generate a buffered driving signal.

To further achieve the above objects in a whole or in parts, a multiplexer is provided according to the present invention that includes a first switching circuit that receives a first input signal, wherein the first switching circuit is enabled by first complementary enable signals of first and second voltage levels to transfer the first input signal; a second switching circuit that receives a second input signal, wherein the first switching circuit is enabled by second complementary enable signals of the second voltage level and a third voltage level to transfer the second input signal, wherein the first and second switching circuits are alternatively enabled in response to first and second complementary enable signals; a selection circuit that has a pull-up unit, and a pull-down unit coupled to the pull-up unit at a node that outputs a selection signal, wherein the pull-up unit pulls up the node to the first voltage level and the pull-down unit pulls down the node signal to the second voltage level; a third switching circuit that receives the first input signal switched from the first switching circuit; and a fourth switching circuit that receives the second input signal switched from the second switching circuit, wherein the third and fourth switching circuits are complementarily enabled by the selection signal to provide one of the first and second input signals to an output terminal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Preferred embodiments of a circuit that produces multilevel output signals according to the present invention can include a first to fourth switching units and a selection signal generating circuit. First, the first switching unit receives high voltage input signals having peak values of a first voltage level and a second voltage level. The first switching unit is turned on by a high voltage output enable signal of the first voltage level or a high voltage output enable bar signal of the second voltage level to transfer the high voltage input signals. The second switching unit receives low voltage input signals having peak values of the second voltage level and a third voltage level. The second switching unit is turned on by a low voltage output enable signal of the second voltage level or a low voltage output enable bar signal of the third voltage level to transfer the low voltage input signals. The selection signal generating circuit preferably includes a pull-up unit for pulling up an output stage to the first voltage level by turning on the pull-up unit by the high voltage output enable signal of the second voltage level and a pull-down unit. The pull-down unit is for pulling down the output stage to the third voltage level by turning on the pull-down unit when the low voltage output enable signal is at the second voltage level.

The third switching unit receives an output signal from the first switching unit and is turned on by a second supply voltage of the second voltage level or an output signal of the first voltage level from the selection signal generating unit. The third switching unit transfers the output signal of the first switching unit to the output stage. The fourth switching unit receives an output signal from the second switching unit and is turned on by the second supply voltage of the second level or an output signal of the third level from the selection signal generating unit. The fourth switching unit transfers the output signal from the second switching unit to the output stage.

Figure 1:
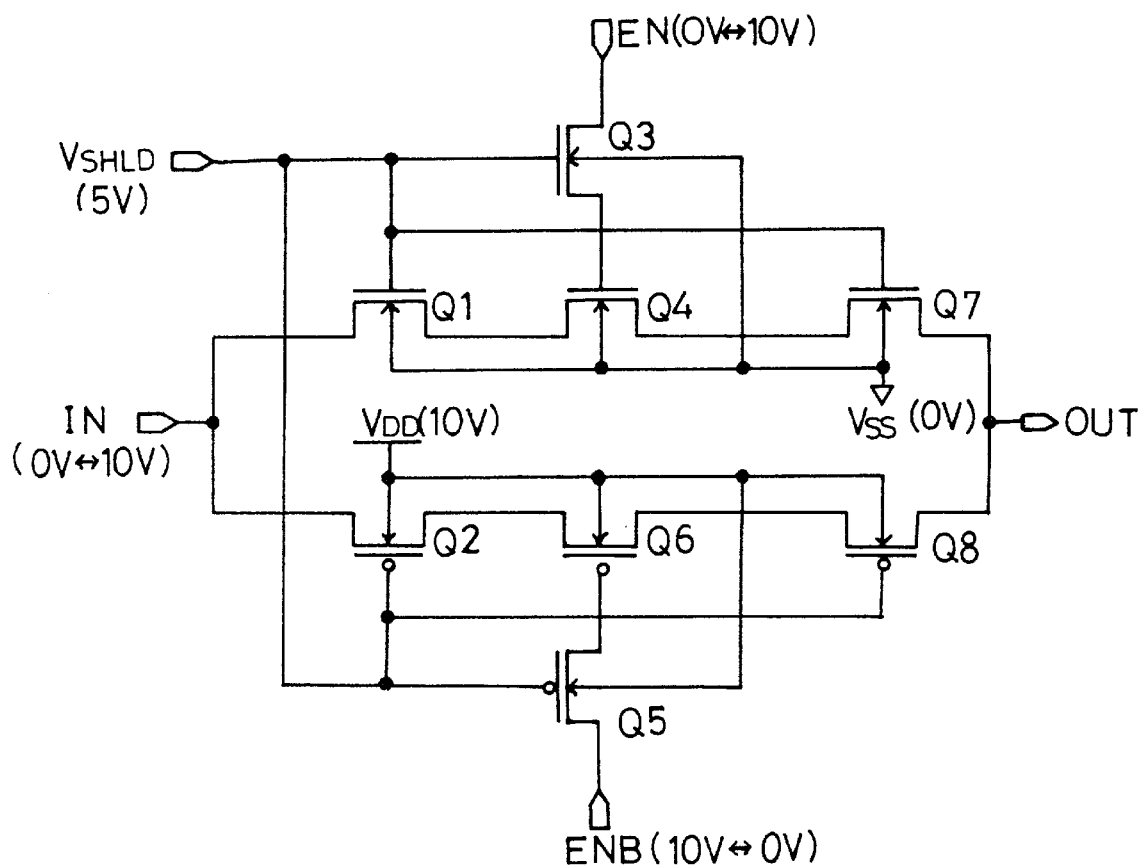
FIG. 1 is a diagram showing a prior art circuit of a transmission gate for producing two-level output signals.
Figure 2:
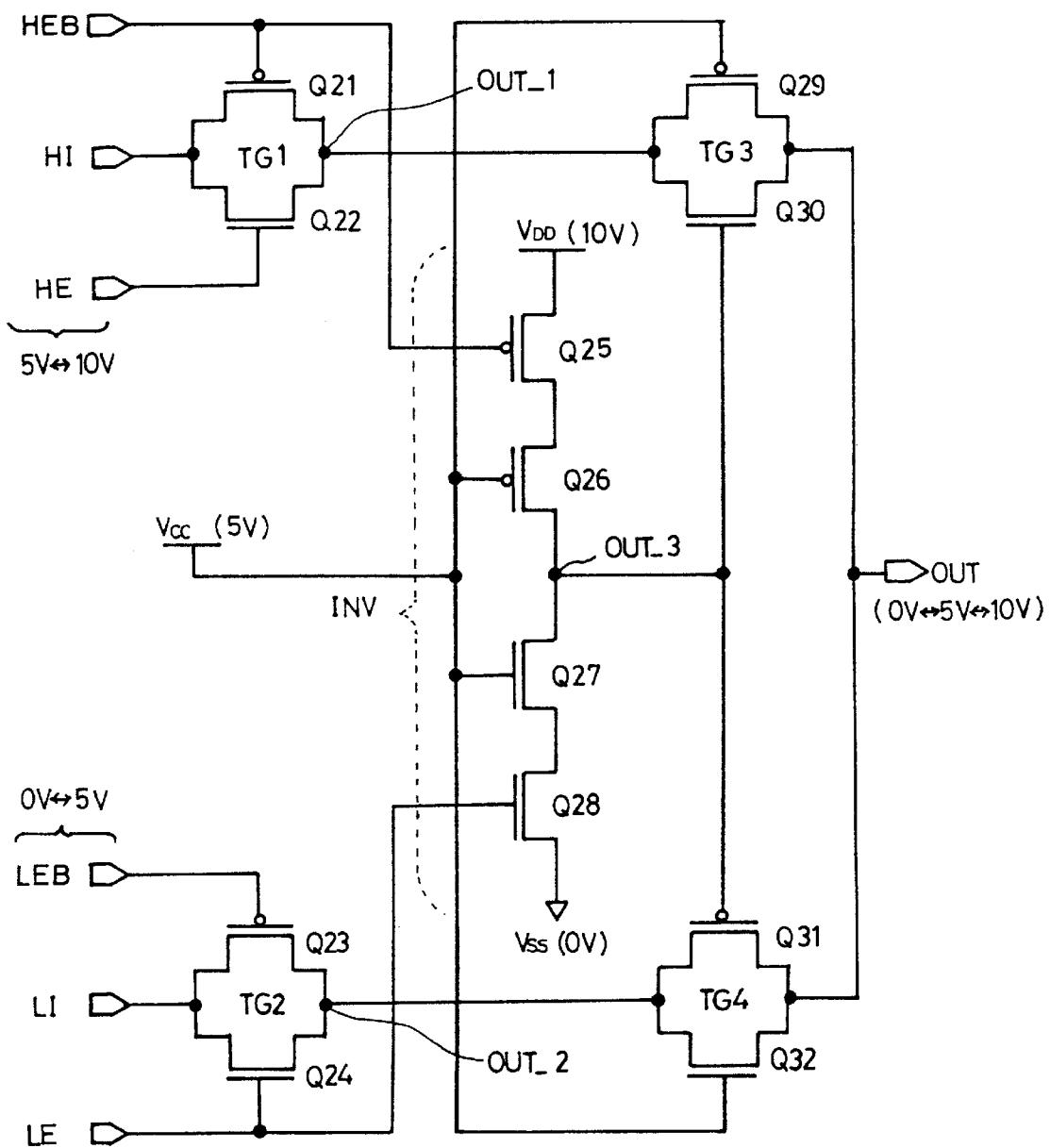
FIG. 2 is a diagram showing a circuit of a preferred embodiment of a multiplexer for producing multi-level output signals according to the present invention.

FIG. 2 is a circuit diagram that shows a first preferred embodiment according to the present invention. In FIG. 2, a transmission gate TG1 includes a PMOS transistor Q21 and an NMOS transistor Q22 as a first switching circuit. A source of the PMOS transistor Q21 and a drain of the NMOS transistor Q22 are coupled together to form an input stage and receive a high voltage input signal HI, which is an analog signal having peak values of 5V and 10V. A drain of the PMOS transistor Q21 and a source of the NMOS transistor Q22 are coupled together to form an output stage and produce an output signal OUT_1. In addition, a gate of the NMOS transistor Q22 is preferably controlled by an high voltage output enable signal HE of 5V or 10V. A gate of the PMOS transistor Q21 is preferably controlled by a high voltage output enable bar signal HEB of 5V or 10V, which is a complementary signal of the high voltage output enable signal HE.

A transmission gate TG2 is a second switching circuit that includes a PMOS transistor Q23 and an NMOS transistor Q24. A source of the PMOS transistor Q23 and a drain of the NMOS transistor Q24 are coupled together to form an input stage and receive a low voltage input signal LI, which is an analog signal having peak values of 0V and 5V. A drain of the PMOS transistor Q23 and a source of the NMOS transistor Q24 are coupled together to form an output stage, which produces an output signal OUT_2. A gate of the NMOS transistor Q24 is preferably controlled by a low voltage output enable signal LE of 0V or 5V. A gate of the PMOS transistor Q23 is preferably controlled by a low voltage output enable bar signal LEB of 0V or 5V, which is a complementary signal of the low voltage output enable signal LE.

The high voltage output enable signal HE, the high voltage output enable bar signal HEB, the low voltage output enable signal LE and the low voltage output enable bar signal LEB described above preferably have inter-relationships described below when a range of the input voltage is 0V to 10V.

HEB=(10−HE)+5

LE=HEB−5

LEB=HE−5

For example, if the high voltage output enable signal HE is set to 10V, the low voltage output enable signal LE is 0V, and both of the high voltage output enable bar signal HEB and the low voltage output enable bar signal LEB are 5V. In another example, if the high voltage output enable signal HE is 5V, the low voltage output enable signal LE also is 5V. The high voltage output enable bar signal HEB then becomes 10V, and the low voltage output enable bar signal LEB becomes 0V.

As shown in FIG. 2, an inverter INV is a selection signal generating circuit that includes two pull-up transistors Q25 and Q26 and two pull-down transistors Q27 and Q28. A source of the PMOS transistor Q25 receives a supply voltage VDD of 10V and its gate is controlled by the high voltage output enable bar signal HEB. A source of the PMOS transistor Q26 is coupled to a drain of the PMOS transistor Q25 and a gate of the PMOS transistor Q26 is controlled by a supply voltage VCC of 5V. A drain of the NMOS transistor Q27 is coupled to a drain of the PMOS transistor Q26 to form an output stage that produces an output signal OUT_3, and a gate of the NMOS transistor Q27 is controlled by the supply voltage VCC. A drain of the NMOS transistor Q28 is coupled to a source of the NMOS transistor Q27, and a gate of the NMOS transistor Q28 is controlled by the low voltage output signal LE. A source of the NMOS transistor Q28 is grounded.

A transmission gate TG3 is a third switching circuit that preferably includes a PMOS transistor Q29 and an NMOS transistor Q30. A source of the PMOS transistor Q29 and a drain of the NMOS transistor Q30 are coupled together to form an input stage that receives the output signal OUT_1 of the transmission gate TG1. A drain of the PMOS transistor Q29 and a source of the NMOS transistor Q30 are coupled together to form an output stage, which produces an output signal OUT. A gate of the PMOS transistor Q29 is controlled by a supply voltage VCC and a gate of the NMOS transistor Q30 is controlled by an output signal OUT_3 from the inverter INV.

A transmission gate TG4 is a fourth switching circuit that includes a PMOS transistor Q31 and a NMOS transistor Q32. A source of the PMOS transistor Q31 and a drain of the NMOS transistor Q32 are coupled together to form an input stage and receive an output signal OUT_2 from the transmission gate TG2. A drain of the PMOS transistor Q31 and a source of the NMOS transistor Q32 are coupled together to form an output stage, which produces the output signal OUT. A gate of the PMOS transistor Q31 is controlled by an output signal OUT_3 from the inverter INV, and a gate of the NMOS transistor Q32 is controlled by the supply voltage VCC.

Multi-level signal output operations of the first preferred embodiment of a multiplexer according to the present invention will now be described. Operational characteristics of the two transmission gates TG1 and TG2 of an input stage of the multiplexer are such that the two transmission gates TG1 and TG2 operate complementarily or alternatively.

If the high voltage output enable signal HE is set to 10V, the high voltage output enable bar signal HEB becomes 5V, which turns on the transmission gate TG1. Thus, the high voltage input signal HI, which is an analog signal having peak values of 5V and 10V, is transferred through the turned-on transmission gate TG1. At this time, the low voltage output enable signal LE is 0V and the low voltage output enable bar signal LEB is 5B, which turns off the transmission gate TG2. Thus, the low voltage input signal LI can not be transferred.

If the high voltage output enable signal HE is set to 5V, the high voltage output enable bar signal HEB becomes 10V, which turns off the transmission gate TG1. At this time, the low voltage output enable signal LE is 5V, and the low voltage output enable bar signal LEB is 0V, which turns on the transmission gate TG2. Thus, the low voltage input signal LI, which is an analog signal having peak values of 0V and 5V, is transferred through the turned on transmission gate TG2.

Operations of the inverter INV are also controlled by the high voltage output enable bar signal HEB and the low voltage output enable signal LE. The high voltage output enable bar signal HEB and the low voltage output enable signal LE preferably have a voltage difference of 5V. When the transmission gate TG1 is turned on, the high voltage output enable bar signal HEB is 5V, and the low voltage output enable signal LE is 0V. On the contrary, when the transmission gate TG2 is turned on, the high voltage output enable bar signal HEB is 10V, and the low voltage output enable signal LE is 5V.

If the high voltage output enable bar signal HEB is 5V when the transmission gate TG1 is turned on, the PMOS transistor Q25, which is the pull-up transistor, is turned on and the source of the PMOS transistor Q26 receives a supply voltage VDD of 10V. Since the gate of the PMOS transistor Q26 always receives the supply voltage VCC of 5V, it is turned on when its source receive the 10V supply voltage VDD. At this time, since the low voltage output enable signal LE is 0V, an NMOS transistor Q28, which is the pull-down transistor, is turned off. Thus, an output signal OUT_3 from the inverter INV becomes to 10V by the supply voltage VDD.

If the high voltage output enable bar signal HEB is 10V, the PMOS transistor Q25 is turned off and the transmission gate TG2 is turned on. At this time, since the low voltage enable signal LE is 5V, the NMOS transistor Q28 coupled to the ground terminal of 0V is turned on, and the voltage of 0V is provided to the source of the NMOS transistor Q27. Since the supply voltage VCC of 5V is always provided to the gate of the NMOS transistor Q27, the NMOS transistor Q27 is turned on by receiving 0V at its source. Thus, the output signal OUT_3 from the inverter INV becomes to 0V by the ground voltage.

The two transmission gates TG3 and TG4 that also form an output stage of the multiplexer operate complementarily or alternatively. A gate of the PMOS transistor Q29, which forms the transmission gate TG3 with the NMOS transistor Q30, always receives the supply voltage VCC of 5V. Thus, the transmission gate TG3 is turned on by receiving the output signal OUT_1 having peak values of 5V and 10V from the transmission gate TG1. In addition, under the condition that the transmission gate TG1 is turned on, since the output signal OUT_3 of the inverter INV is also 10V, the output signal OUT_3 turns on the NMOS transistor Q30. As a result, under the condition that the transistor TG1 is turned on, the transmission gate TG3 is also turned on and then analog signals having peak values of 5V and 10V are produced at the output stage OUT.

A gate of the NMOS transistor Q32 that forms the transmission gate TG4 of the output stage with the PMOS transistor Q31 always receives the supply voltage VCC of 5V. Thus, the transmission gate TG4 is turned on by receiving the output signal OUT_2 having peak values of 0V and 5V from the transmission gate TG2. Also, under the condition that the transmission gate TG2 is turned on, since the output signal OUT_3 from the inverter INV is 0V, the output signal OUT_3 turns on the PMOS transistor Q31. As a result, under the condition that the transmission gate TG2 is turned on, the transmission gate TG4 is also turned on and then analog signals having peak values of 0V and 5V are produced at the output stage OUT.

Figure 3:
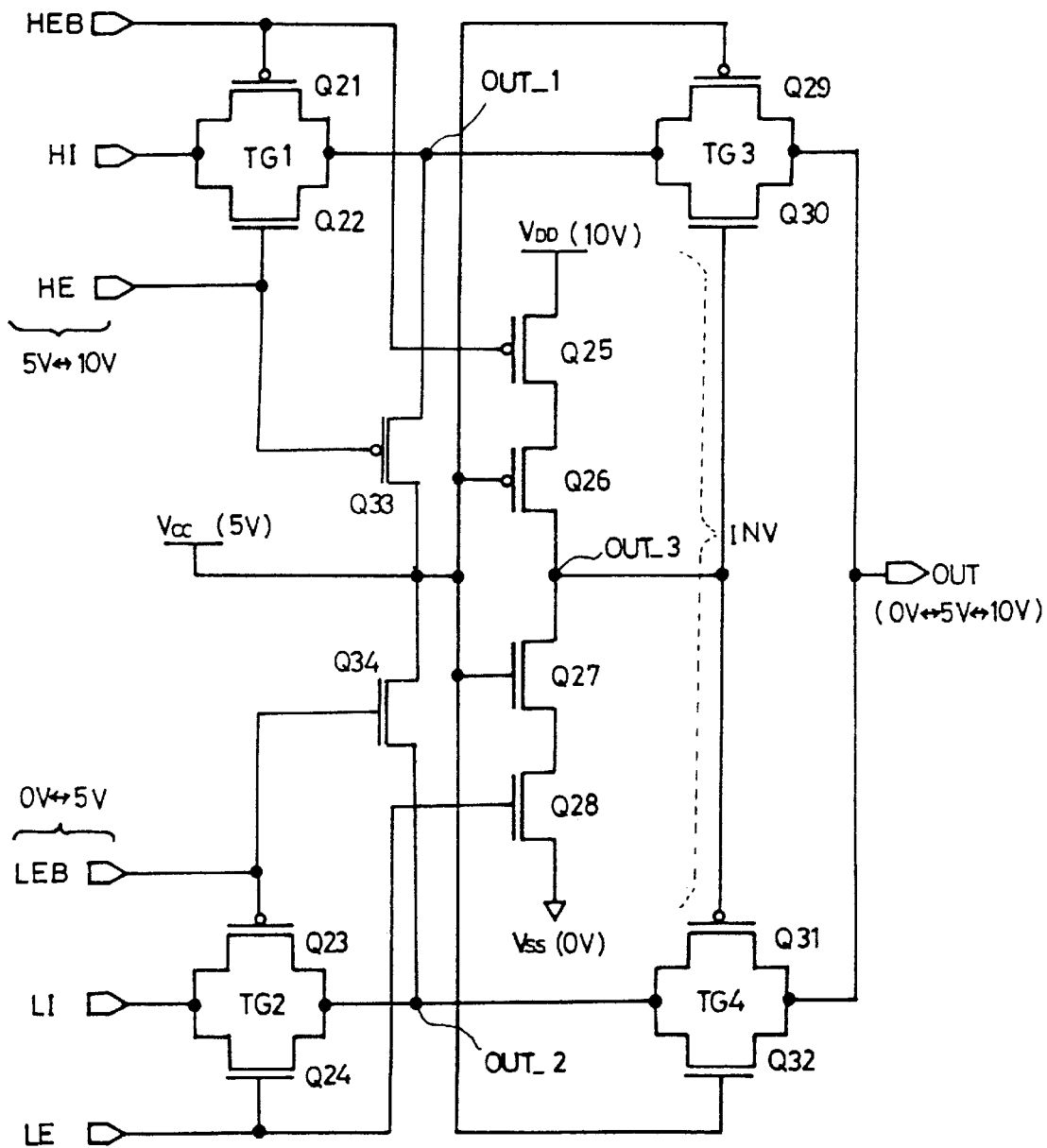
FIG. 3 is a diagram showing a circuit of another preferred embodiment of a multiplexer according to the present invention.

FIG. 3 is a circuit diagram showing a second embodiment of a multiplexer according to the present invention. The second preferred embodiment of the multiplexer of FIG. 3 is similar to the multiplexer of FIG. 2. However, the second preferred embodiment includes a unit that prevents the transmission gates TG3 and TG4 of the multiplexer from being broken down by the output voltage OUT.

First, a PMOS transistor Q33 is coupled between the input stage of the transmission gate TG3 and the supply voltage VCC and a gate of the PMOS transistor Q33 is controlled by the high voltage output enable signal HE. An NMOS transistor Q34 is coupled between the input stage of the transmission gate TG4 and the supply voltage VCC, and a gate of the NMOS transistor Q34 is controlled by the enable bar signal LEB.

Under the condition that the transmission gate TG1 is turned on, the PMOS transistor Q33 is turned off and the NMOS transistor Q34 is turned on. Thus, the input stage of the transmission gate TG4 receives the supply voltage VCC of 5V through the turned on NMOS transistor Q34. When the transmission gate TG1 is turned on, the output stage OUT produces analog signals having peak values of 5V and 10V. If the voltage of the input stage of the transmission gate TG4 is 0V not 5V, the transistors constituting transmission gate TG4 of the output stage OUT are broken down by the maximum 10V output voltage. However, if the input stage of the transistor TG4 is maintained to the supply voltage VCC level of 5V when the transmission gate TG1 is turned on, the transistors can be prevented from being broken down by the high voltage (or low voltage) output signal.

In the multiplexer according to the second preferred embodiment of the present invention, the signal source of high voltage signals having peak values of 5V and 10V is coupled to the input stage of the transmission gate TG1, the signal source of low voltage signals having peak values of 0V and 5V is coupled to the transmission gate TG2, and the high voltage output enable signal HE, which is a control signal, is alternatively provided at 5V and 10V. Thus, analog signals of low voltage signal (0V to 5V) and high voltage signal (5V to 10V) in different ranges can be produced through a single multiplexer.

Figure 4:
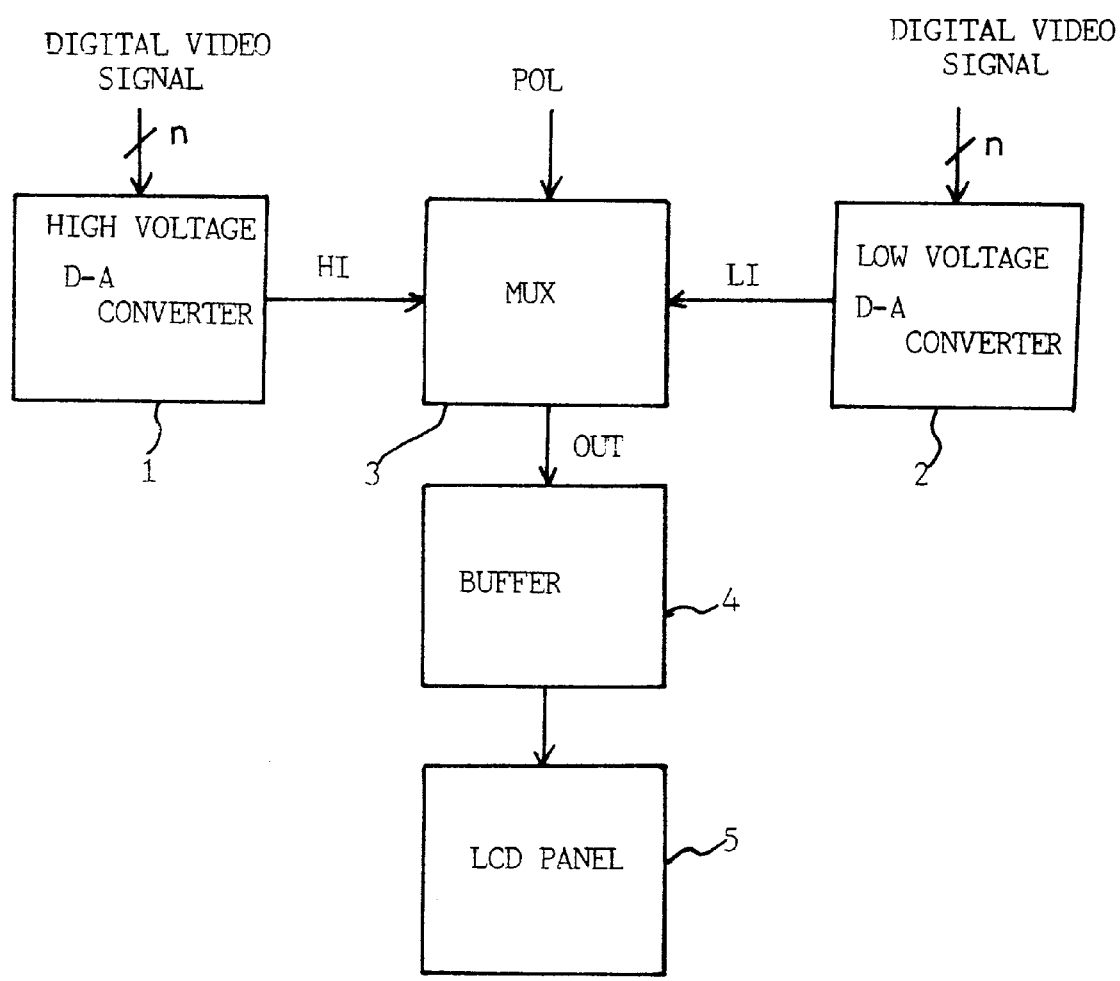
FIG. 4 is a diagram showing an exemplary configuration of embodiments of a multiplexer according the present invention coupled to a high voltage signal source and a low voltage signal source.

FIG. 4 is a block diagram showing a preferred embodiment of multiplexer 3 according to the present invention coupled to a high voltage signal source and a low voltage signal source. The high voltage signal source is a high voltage D-A converter 1 that converts a n-bit digital video signal to the high voltage analog signal HI in an LCD driving circuit. The low voltage signal source is a low voltage D-A converter 2 that converts the n-bit digital video signal to the low voltage analog signal LI. The high voltage analog signal HI and the low voltage analog signal LI supplied to a multiplexer 3 is selectively produced in accordance with a logical value of a polarity control signal POL. The polarity control signal POL is preferably an alternative signal that controls alternative output operation of the high voltage analog signal HI and the low voltage analog signal LI. That is, the polarity control signal POL can control on/off operations of the two transmission gates TG1 and TG2 in FIGS. 2 and 3 by determining the voltage levels of the high voltage output enable signal HE. The driving capability of the output signal OUT of the multiplexer 3 of the present invention is enhanced by a buffer 4. The output signal of the buffer 4 having enhanced driving capability is transferred to a LCD panel and drives liquid crystal cells.

As described above, the preferred embodiments according to the present invention have various advantages. The preferred embodiments of the present invention provides a multiplexer for producing multi-level output signals that permit a full swing of the output voltage. The preferred embodiments selectively provide two different level output signals through a single output stage and can include a protection circuit that prevents breakdown of transistors of an output stage occurred by providing different-level signals to a single output stage.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A multiplexer, comprising:
   a first switching circuit that receives a first input signal;
   a second switching circuit that receives a second input signal, wherein the first and second switching circuits are complementarily enabled in response to first control signals;
   a third switching circuit that receives the first input signal switched from the first switching circuit;
   a fourth switching circuit that receives the second input signal switched from the second switching circuit, wherein the third and fourth switching circuits are complementarily enabled by a selection signal to provide one of the first and second input signals to an output terminal; and
   a selection circuit that receives high, intermediate and low prescribed voltages, outputs one of the high prescribed voltage and the low prescribed voltage as the selection signal to enable the third and fourth switching circuits.

2. The multiplexer of claim 1, wherein the selection circuit comprises:
   a pull-up unit that pulls up the selection signal to the high prescribed voltage; and
   a pull-down unit that pulls down the selection signal to the low prescribed voltage.

3. The multiplexer of claim 1, wherein the first input signal has peaks being the high prescribed voltage and the intermediate prescribed voltage, wherein the second input signal has peaks being the intermediate prescribed voltage and the low prescribed voltage, wherein the high, low and intermediate prescribed voltages are respectively 10V, 0V and 5V, and wherein the selection circuit is an inverter.

4. The multiplexer of claim 1, wherein the third and fourth switching circuits receive the intermediate prescribed voltage, wherein the third switching circuit is turned on by the selection signal of the high prescribed voltage, and wherein the fourth switching circuit is turned on by the selection signal of the low prescribed voltage.

5. The multiplexer of claim 1, wherein the selection circuit is an inverter comprising four transistors coupled in series between the high prescribed voltage and low prescribed voltage, wherein a source of the first transistor receives the high prescribed voltage and its gate is controlled by a first signal of the first control signals, wherein a source of the second transistor is coupled to a drain of the first transistor and a gate of the second transistor receives the intermediate prescribed voltage, wherein a drain of the third transistor is coupled to a drain of the second transistor to output the selection signal and a gate of the third transistor receives the intermediate prescribed voltage, and wherein a drain of the fourth transistor is coupled to a source of the third transistor and a gate of the fourth transistor is coupled by a second signal of the first control signals.

6. The multiplexer of claim 1, wherein the high prescribed voltage and the low prescribed voltage are different, and wherein the intermediate prescribed voltage is between the high and low prescribed voltages.

7. The multiplexer of claim 1, wherein the first switching circuit is a transmission gate, comprising:

first and second transistors, wherein a source of the first transistor and a drain of the second transistor are coupled together and receive the first input signal, a drain of the first transistor and a source of the second transistor are coupled together, a gate of the second transistor and a gate of the first transistor are respectively controlled by complementary enable signals of the first control signals that alternately have high and intermediate prescribed voltages.

8. The multiplexer of claim 1, wherein the second switching circuit is a transmission gate comprising:

first and second transistors, wherein a source of the first transistor and a drain of the second transistor are coupled together and receive the second input signal, a drain of the first transistor and a source of the second transistor are coupled together, a gate of the second transistor and a gate of the first transistor are respectively controlled by complementary enable signals of the first control signals that alternately have intermediate and low prescribed voltages.

9. The multiplexer of claim 1, wherein the third switching circuit is a transmission gate comprising:

first and second transistors, wherein a source of the first transistor and a drain of the second transistor are coupled together and receive the first input signal switched from the first switching circuit, wherein a drain of the first transistor and a source of the second transistor are coupled together, wherein a gate of the first transistor is controlled by a voltage source of an intermediate prescribed voltage, and wherein a gate of the second transistor is controlled by the selection signal.

10. The multiplexer of claim 1, wherein the fourth switching circuit is a transmission gate comprising:

first and second transistors, wherein a source of the first transistor and a drain of the second transistor are coupled together and receive the second input signal switched from the second switching circuit, wherein a drain of the first transistor and a source of the second transistor are coupled together, wherein a gate of the first transistor is controlled by a voltage source of the intermediate prescribed voltage, and wherein a gate of the second transistor is controlled by the selection signal.

11. The multiplexer of claim 1, further comprising a fifth switching circuit that selectively couples an intermediate prescribed voltage to input terminals of the third and fourth switching circuits based on the first control signals.

12. A driver for a LCD panel, comprising:

a first D/A converter that outputs a first data signal;

a second D/A converter that outputs a second data signal;

a multiplexer that receives the first and second data signals and outputs one of the first and second data signals as an output signal, wherein the multiplexer comprises a first switching circuit that receives the first data signal, a second switching circuit that receives the second data signal, wherein the first and second switching circuits are complementarily enabled in response to first control signals, a third switching circuit that receives the first data signal switched from the first switching circuit, a fourth switching circuit that receives the second data signal switched from the second switching circuit, wherein the third and fourth switching circuits are complementarily enabled by a selection signal to provide one of the first and second data signals as the output signal, and a fifth switching circuit that selectively couples an intermediate prescribed voltage level to input terminals of the third and fourth switching circuits to maintain a voltage differential with the output signal less than a prescribed breakdown voltage, said fifth switching circuit being responsive to the first control signals; and a buffer that buffers the output signal received from the multiplexer to generate a buffered driving signal.

13. The driver of claim 12, the multiplexer further comprising a selection circuit that outputs one of a high prescribed voltage output signal and a low prescribed voltage output signal as the selection signal to enable the third and fourth switching circuits.

14. The driver of claim 12, wherein the first input signal is one of a high prescribed voltage level and the intermediate prescribed voltage level, wherein the second input signal is one of the intermediate prescribed voltage level and a low prescribed voltage level, wherein the high, low and intermediate prescribed voltage levels are respectively 10V, 0V and 5V, and wherein the selection circuit is an inverter.

15. The driver of claim 12, wherein the third and fourth switching circuits receive the intermediate prescribed voltage level, wherein the third switching circuit is turned on by the selection signal of a high prescribed voltage level, and wherein the fourth switching circuit is turned on by the selection signal of a low prescribed voltage level.

16. A multiplexer, comprising:

a first switching circuit that receives a first input signal, wherein the first switching circuit is enabled by first complementary enable signals of first and second voltage levels to transfer the first input signal;

a second switching circuit that receives a second input signal, wherein the second switching circuit is enabled by second complementary enable signals of the second voltage level and a third voltage level to transfer the second input signal, wherein the first and second switching circuits are alternately enabled in response to the first and second complementary enable signals;

a selection circuit that comprises
  a pull-up unit, and
  a pull-down unit coupled to the pull-up unit at a node that outputs a selection signal, wherein the pull-up unit pulls up the node to the first voltage level and the pull-down unit pulls down a node signal to the second voltage level;

a third switching circuit that receives the first input signal switched from the first switching circuit; and a fourth switching circuit that receives the second input signal switched from the second switching circuit, wherein the third and fourth switching circuits are complementarily enabled by the selection signal to provide one of the first and second input signals to an output terminal.

17. The multiplexer of claim 16, wherein the third and fourth switching circuits receive an intermediate prescribed voltage level, wherein the third switching circuit is turned on by the selection signal of a high prescribed voltage level, and wherein the fourth switching circuit is turned on by the selection signal of a low prescribed voltage level.

18. The multiplexer of claim 17, wherein the high prescribed voltage level and the low prescribed voltage level are different, and wherein the intermediate prescribed voltage level between the high and low prescribed voltage levels.

19. A multiplexer, comprising:

a first switching circuit that receives a first input signal;

a second switching circuit that receives a second input signal, wherein the first and second switching circuits are complementarily enabled in response to first control signals;

a third switching circuit that receives the first input signal switched from the first switching circuit; and a fourth switching circuit that receives the second input signal switched from the second switching circuit, wherein the third and fourth switching circuits are complementarily enabled by a selection signal to provide one of the first and second input signals to an output terminal, wherein at least one of the first, second, third and fourth switching circuits is a transmission gate having first and second transistors, wherein a source of the first transistor and a drain of the second transistor are coupled together, a drain of the first transistor and a source of the second transistor are coupled together, wherein (1) a gate of the second transistor and a gate of the first transistor are respectively controlled by complementary enable signals of the first control signals that alternately have high and intermediate prescribed voltages or (2) the gate of the first transistor is controlled by a voltage source of the intermediate prescribed voltage, and a gate of the second transistor is controlled by the selection signal.

20. A multiplexer, comprising:

a first switching circuit that receives a first input signal;

a second switching circuit that receives a second input signal, wherein the first and second switching circuits are complementarily enabled in response to first control signals;

a third switching circuit that receives the first input signal switched from the first switching circuit;

a fourth switching circuit that receives the second input signal switched from the second switching circuit, wherein the third and fourth switching circuits are complementarily enabled by a selection signal to provide one of the first and second input signals to an output terminal; and a fifth switching circuit that selectively couples an intermediate prescribed voltage to input terminals of the third and fourth switching circuits based on the first control signals.

* * * * *